United States Patent [19]

McKiel, Jr.

[11] Patent Number: 4,687,897
[45] Date of Patent: Aug. 18, 1987

[54] FLAME-OFF LIMITED CIRCUIT FOR WIRE BONDING BALL FORMING APPARATUS

[75] Inventor: Frank A. McKiel, Jr., Dallas, Tex.

[73] Assignee: Rockwell International Corporation, El Segundo, Calif.

[21] Appl. No.: 934,042

[22] Filed: Nov. 24, 1986

[51] Int. Cl.4 .............................................. B23K 11/22
[52] U.S. Cl. ................................ 219/56.21; 219/56.22
[58] Field of Search .................. 219/56.21, 56.22, 136, 219/130.4

[56] References Cited

U.S. PATENT DOCUMENTS 4,390,771 6/1983 Kurtz et al. ...................... 219/56.22

Primary Examiner—Clifford C. Shaw
Attorney, Agent, or Firm—Bruce C. Lutz; V. L. Sewell; H. Fredrick Hamann

[57] ABSTRACT

It has been ascertained that there is a momentary drop in the flame-off arc voltage used to produce a ball in a ball bonder when the ball contacts the tool tip. A part of the present invention comprises a circuit for detecting this voltage drop and terminating the arc voltage immediately after such contact is made.

5 Claims, 3 Drawing Figures

FLAME-OFF LIMITED CIRCUIT FOR WIRE BONDING BALL FORMING APPARATUS

THE INVENTION

The present invention is generally concerned with wire bonding techniques and, more specifically, with thermocompression, thermosonic and ultrasonic bonding, and even more specifically, with terminating the flame-off arc voltage in a manner such as to reduce thermal shock to the capillary tip and reduce trash buildup on the tip.

Thermocompression bonding techniques have been around since at least 1957 and one of the earlier patents on the subject is U.S. Pat. No. #3,006,067 to Anderson et al.

BACKGROUND

Wire bonding is defined herein as the process of interconnecting points in an electronic circuit using bare, small diameter wires or ribbons which are usually made of gold or aluminum. The installed wire links are attached at either end by temporary contact with a tool which provides a combination of force and/or heat and/or ultrasonic energy to effect a weld of the wire to the bond surface or termination means. Wire bonds are generally divided into two main categories of wedge-wedge and ball-wedge. A wedge bond or termination results from forces applied perpendicular to a long axis of a wire to "pinch" it against the surface being bonded or the bond surface. In contrast, a ball bond is formed by first having a length of wire protruding from a small hole in the tip of a conical tool or "capillary". This wire length, known as the "tail", is then melted into a ball that is, of course, larger than the original wire diameter. In order to attach this mass to a bonding surface, the tool tip engages the periphery of the ball and applies the bond forces along the same axis as the length of the wire.

A ball-wedge bonder uses a sequence of forming a ball, attaching the ball, trailing wire from the ball through the hole in the capillary to form the wire's length and shape in the circuit. The other end is attached by using the rounded face surrounding the hole or capillary of the very same tool to then pinch the wire, thereby forming a wedge bond.

In ball-wedge bonding, two techniques are prevalent for melting the length of wire extending from the capillary tip. In each case the process is referred to as "flame-off". One approach or technique is to use a hydrogen torch and the other is called electronic flame-off. The electronic flame-off technique uses an electrode which approaches the wire and discharges a high voltage arc to melt the wire into a ball. The duration and intensity of the arc are usually controllable parameters set to values which accomplish sufficient melting of the wire to form an appropriate size ball.

A nominal set of values in a flame-off of a one mil diameter gold wire requires about two milliseconds at a current of 4 milliamps to form a ball 2.5 times the wire diameter. In such a situation, the high voltage arcing source may initially provide voltages up to 2,000 volts, but the arc, once established, maintains a voltage drop of about 400 to 500 volts. This drop in voltage is monitored by most electronic flame-off systems to flag improper flame-offs due to the wire being absent from the capillary (an open circuit condition) or being too long (and thus causing a short circuit). The error signal often causes an audible warning in a manual bonder or halts the operation of an automatic bonder.

As the melted ball draws against the capillary during flame-off, the heat is dissipated rapidly into the capillary tip and the ball melts no further. Any further application of the high voltage arc accomplishes nothing but metal sputtering and carbonizing from the ambient air. The disadvantage to allowing further arcing is the adverse effects related to a coating of the wire material of the capillary tool.

In the prior art, there have been two approaches to controlling ball size. In the tail length limited mode, the amount of wire protruding from the capillary is carefully controlled by some mechanical means, and then an excess of arc energy is provided to guarantee that all the protruding wire is consumed. Although this produces reduced tool life due to thermal shock, there is accurate ball size control and the ball nests and conforms to the tool tip and is well centered to allow accurate targeting of the bond.

The other approach is an energy limited mode, wherein the electronic flame-off duration and current is controlled to act on an excess length of wire. In this case, the melt does not contact the capillary tip of the tool and no thermal shock is introduced, so tool life is prolonged. However, the ball may occasionally fail to center under the tool properly during bonding, and thus increases the likelihood of an improper bond in the next bonding operation.

The present invention comprises an electronic means for monitoring and controlling the electronic flame-off based upon the present inventor's discovery that the voltage drop across the arc diminishes slightly when the melt contacts the capillary tip. The present detection system thus terminates the application of the arc instantly upon the ball touching the capillary to prevent unnecessary sputtering and charring in a tail length limited mode. This detection system may also be used in an energy limited mode to indicate improper operation.

It is thus an object of the present invention to provide an improved approach to terminating the application of a flame-off arc in a ball-wedge bonder to prolong tool life.

Other objects and advantages of the present invention will be apparent from a reading of the specification and appended claims in conjunction with the drawings wherein FIG. 1 is a block diagram of a portion of an electronic flame-off device including the present inventive concept;

FIG. 2 is a schematic diagram of a circuit for providing the detection appropriate to the inventive concept; and FIG. 3 is a graph used in explaining the operation of the circuit of FIG. 2.

DETAILED DESCRIPTION

Figure 1:
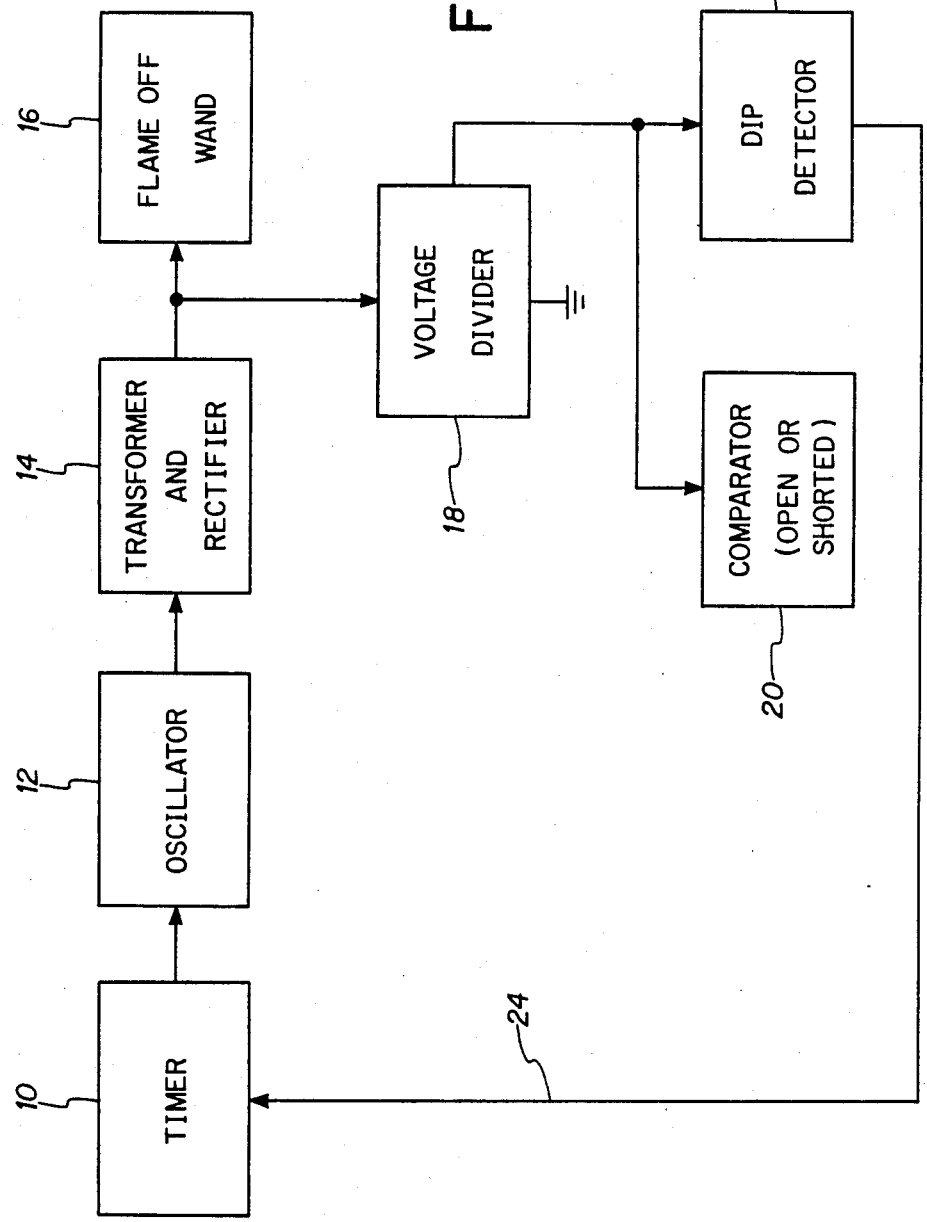

In FIG. 1, a timer block 10 provides output signals to an oscillator 12, which is connected to a transformer and rectifier block that provides high voltage signals to a flame-off wand 16. The output of the high voltage transformer and rectifier 14 is also supplied to a voltage divider 18 which divides the output voltage from 14 and supplies a portion of it to a comparator 20 and to a dip detector 22. An output of the dip detector is supplied on a lead 24 to the timer 10. All the blocks of FIG. 1, other than block 22, are typically found in a commercial ball-wedge bonding machine. While there is other electronic circuitry in such a ball-wedge bonder, the portions shown are those pertinent to the present invention.

Figure 2:
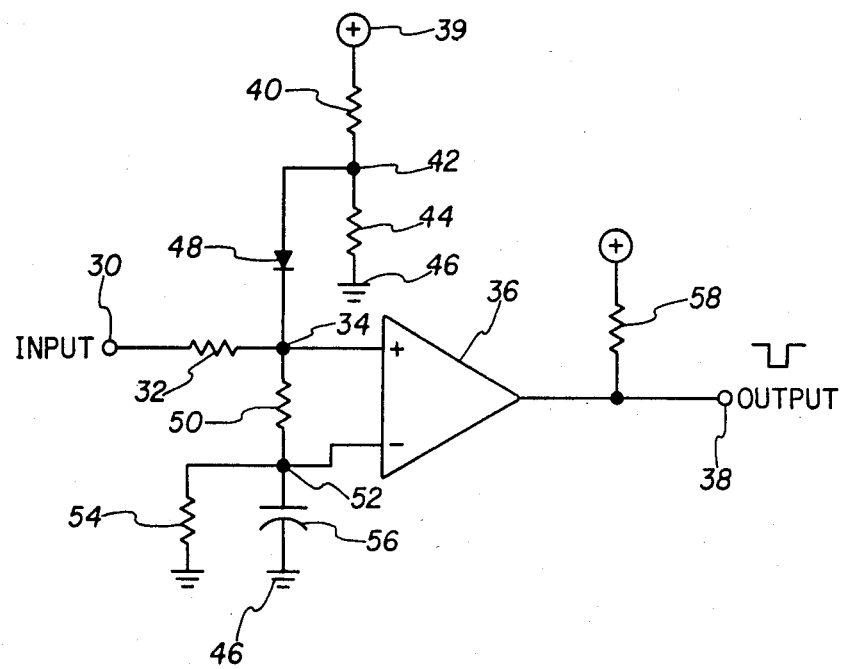

In FIG. 2, a signal input means 30 is shown connected to one end of a resistor 32 whose other end is connected to a junction point 34. Junction point 34 is connected to a positive or non-inverting input of an operational amplifier or comparator 36 whose output is connected to an output terminal 38. Output 38 in FIG. 1 would be connected to terminal 24. A positive power supply source 39 is connected to one end of a resistor 40 whose other end is connected to a junction point 42. A resistor 44 is connected between junction point 42 and ground 46. A diode 48 is connected between junction point 42 and junction point 34. A resistor 50 is connected between junction point 34 and a junction point 52. Junction point 52 is connected to the inverting or minus input of operational amplifier 36. A resistor 54 and a capacitor 56 are connected in parallel between junction point 52 and ground 46. A resistor 58 is connected between the positive power supply 39 and output 38.

Figure 3:
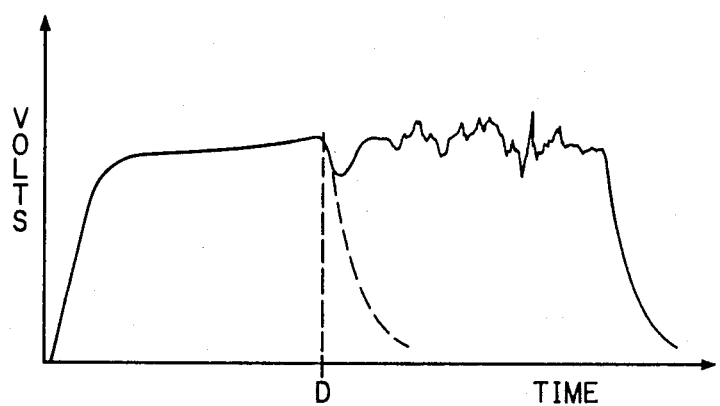

In FIG. 3, the horizontal axis represents increasing amounts of time from the beginning of a command to the transformer 14 to provide an output signal, while the vertical axis represents volts. A point D is shown on the horizontal axis which represents the point at which the dip detector 22 of FIG. 1 recognizes that there is a dip in the voltage or a negative slope to the signal, and applies an output such as shown adjacent output 38 of FIG. 2 to the timer 10 to reset the timer for the next flame-off operation. The next flame-off operation would not occur until after both a ball bonding and the next wedge bonding had occurred.

OPERATION

As will be realized by those skilled in the ball-wedge bonding art, after wedge bond has been completed, a mechanism is used to lock the position of the wire in the capillary tool from which the bonding wire is obtained. The tool is then moved from the wedge bond area and in the process the wire will break in the area of the bond. As a result, there will be a portion of wire extending from the end of the capillary bonding tool. The wire which extends from the capillary bonding tool is then positioned near a flame-off wand such as block 16 of FIG. 1. At this time, an activating signal (not shown) is supplied to timer 10 to cause it to actuate a device, such as oscillator 12, which has its output transformed to a higher voltage and rectified by circuitry such as block 14. The high voltage is then applied to the flame-off wand 16 to commence the ball forming operation. The signal is divided to usable levels by voltage divider 18, and in the prior art devices, there is a circuit, such as comparator 20. If the extended wire is so long that it shorts against the wand 16, a warning will be provided or the bonder will be shut down. If there is no wire, so that the arcing process cannot even begin, the comparator provides a warning signal or shuts the bonder down. The first instance of shorting would prevent the voltage from ever rising, and if it were open, the voltage would rise too high and/or too suddenly. On the other hand, if the circuit is providing normal operation as shown in FIG. 3, the steeply rising portion is the turn-on ramp portion of the high voltage arc supplied by 14, the reasonably level portion immediately thereafter is the time during which the tail is being melted to form a ball. Typically, the ball is formed in less than two milliseconds. The point D, as previously mentioned, is the point at which contact is made between the ball and the capillary tool, and this causes a momentary dip in the voltage. If the high voltage arc were allowed to continue, the erratic voltage illustrated subsequent to D is that caused by sputtering and excess arcing. Finally, the drop occurs when the timer finally indicates to the oscillator that it should quit under prior art operations. However, the present invention would turn the device off substantially immediately and the turn-off ramp would be that shown by the falling dash line.

Referring to FIG. 2, it can be easily ascertained that the capacitor 56 would be normally charged by the incoming signal on lead 30 as the input signal rises, and this would keep the output of amplifier 36 at terminal means 38 at a high level. However, if the voltage on terminal 30 were to drop, the capacitor 56 could not readily discharge, and the amplifier 36 would provide a negative going output signal, such as shown adjacent terminal 38. This negative going signal would be received by timer 10 to terminate the performance of oscillator 12. The time between flame-off operations would be sufficient for the capacitor 56 to again discharge and be available for the next detection operation.

While I have described a preferred embodiment of the inventive concept, I wish to be limited only to the concept described in the claims of monitoring the voltage applied to the output of a ball wedge bonder for a negative slope or dip, which negative slope or dip indicates contact between the ball and the capillary tool used in the bonding operation and terminating application of the ball forming arc when this dip is detected as claimed in the appended claims.

I thus claim:

1. The method of time limiting the operation of electronic flame-off apparatus comprising the steps of:
    applying a high voltage arc to a bonding wire extending from a capillary tip of a wire bonding means;
    monitoring the voltage slope of the applied voltage arc; and
    terminating the application of the high voltage arc when a negative slope is detected.

2. Electronic flame-off termination apparatus for use with ball-wedge wire bonding means having an internal timer reset means and output means for providing a signal indicative of the flame-off arc voltage comprising, in combination:
    signal input first means;
    signal dropping resistive second means having first and second terminal means;
    signal integrating third means;
    means for connecting said second means in series between said first means and said third means so that said first terminal means of said second means connected to said first means is typically at a larger absolute potential than said second terminal means connected to said third means; and
    comparator fourth means connected to said first and second terminal means for supplying a flame-off terminating output signal to internal timer reset means when the potential of said second terminal means exceeds that of said first terminal means.

3. Apparatus for time limiting the operation of electronic flame-off apparatus comprising, in combination:
    first means for applying a high voltage arc to a bonding wire extending from a capillary tip of a wire bonding means;

second means, connected to said first means, for monitoring the voltage slope of the applied voltage arc; and third means, comprising a part of said second means and connected to said first means, for terminating the application of the high voltage arc when a negative slope is detected in the high voltage arc.

4. Flame-off apparatus comprising, in combination:

timer means, including reset means and output means, for providing an output signal until receipt of a reset signal;

high voltage means, including input means connected to said output means of said timer means and output means for providing a continuously rising high voltage output signal;

flame-off wand means connected to said output means of said high voltage means; and dip detector means, including input means connected to said output means of said high voltage means and including output means connected to said reset means of said timer means, for providing a reset signal to said timer means whenever a dip is detected in the voltage applied to said flame-off wand means.

5. Flame-off apparatus comprising, in combination:

timer first means, including reset means and output means, for providing an output signal until receipt of a reset signal;

second means comprising oscillator means, transformer means and rectifier means and including input means connected to said output means of said first means and output means for providing a high voltage output signal while receiving an input signal;

flame-off wand third means connected to said output means of said second means; and dip detector fourth means, including input means connected to said output means of said second means and including output means connected to said reset means of said first means, for providing a reset signal to said first means when a negative slope is detected in the voltage applied to said third means.

* * * * *